(12) United States Patent
Wenham et al.

(10) Patent No.: US 8,772,068 B2
(45) Date of Patent: Jul. 8, 2014

(54) METALLIZATION METHOD FOR SILICON SOLAR CELLS

(75) Inventors: Stuart Ross Wenham, Cronulla (AU); Budi Santoso Tjahjono, Kensington (AU); Nicole Bianca Kuepper, Greenwich (AU); Alison Joan Lennon, Rozelle (AU)

(73) Assignee: Newsouth Innovations PTY Limited, Unsw Sydney, New South Wales (AU)

( * ) Notice: Subject to any disclaimer, the term of this patent is extended or adjusted under 35 U.S.C. 154(b) by 0 days.

(21) Appl. No.: 13/504,253

(22) PCT Filed: Oct. 25, 2010

(86) PCT No.: PCT/AU2010/001421
§ 371 (c)(1),
(2), (4) Date: Jul. 13, 2012

(87) PCT Pub. No.: WO2011/050399
PCT Pub. Date: May 5, 2011

(65) Prior Publication Data
US 2012/0282722 A1    Nov. 8, 2012

(30) Foreign Application Priority Data

Oct. 26, 2009 (AU) ................................ 2009905210

(51) Int. Cl.
*H01L 31/18* (2006.01)
(52) U.S. Cl.
USPC .......... 438/58; 257/E27.125; 438/98; 438/558
(58) Field of Classification Search
USPC ................ 257/E27.125; 438/57, 98, 558, 58
See application file for complete search history.

(56) References Cited

U.S. PATENT DOCUMENTS

| 5,871,591 A | 2/1999 | Ruby et al. |
| 6,429,037 B1 * | 8/2002 | Wenham et al. ................ 438/57 |
| 8,426,236 B2 * | 4/2013 | Cabral et al. ................... 438/57 |
| 2010/0068886 A1 | 3/2010 | Yu et al. |

OTHER PUBLICATIONS

International Search Report and Written Opinion dated Feb. 3, 2011.
Dastgheib-Shirazi, et al., "Selective Emitter for Industrial Solar Cell Production; A Wet Chemical Approach Using A Single Side Diffusion Process, 23rd European Photovoltaic Solar Energy Conference and Exhibition," Valencia, Sep. 2008, pp. 1197-1199.

(Continued)

*Primary Examiner* — John C Ingham
(74) *Attorney, Agent, or Firm* — Thomas | Horstemeyer, LLC (57) ABSTRACT

A method of forming contacts on a surface emitter of a silicon solar cell is provided. In the method an n-type diffusion of a surface is performed to form a doped emitter surface layer that has a sheet resistance of 10-40 Ω/□. The emitter surface layer is then etched back to increase the sheet resistance of the emitter surface layer. Finally the surface is selectively plated. A method of fabrication of a silicon solar cell includes performing a front surface emitter diffusion of n-type dopant and then performing a dielectric deposition on the front surface by PECVD. The dielectric deposition comprises:
  a. growth of a thin silicon oxide;
  b. PECVD deposition of silicon nitride to achieve a silicon nitride.
The silicon is then annealed to drive hydrogen from the silicon nitride layer into the silicon to passivate the silicon.

19 Claims, 6 Drawing Sheets

(56) References Cited

OTHER PUBLICATIONS

Sana, et al., "Fabrication and Analysis of High-Efficiency Polycrystalline Silicon Solar Cells," IEEE Transactions on Electron Devices, Aug. 1993, vol. 40, No. 8, pp. 1461-1468.

Tjahjono, et al., "Application of Laser Doped Contact Structure on Multicrystalline Solar cells," 23rd European Photovoltaic Solar Energy Conference and Exhibition, Valencia, Sep. 2008, pp. 1995-2000.

Rohatgi, et al., "Comprehensive Study of Rapid, Low-Cost Silicon Surface Passivation Technologies," IEEE Transactions on Electron Devices, May 2000, vol. 47, No. 5, pp. 987-993.

* cited by examiner

METALLIZATION METHOD FOR SILICON SOLAR CELLS

CROSS REFERENCE TO RELATED APPLICATION

This application is the 35 U.S.C. §371 national stage of PCT application PCT/AU2010/001421, filed Oct. 25, 2010, which claims priority to and the benefit of Australian Patent Application No. 2009905210, filed on Oct. 26, 2009, both of which are hereby incorporated by reference in their entireties.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD OF THE INVENTION

The present invention relates generally to the field of solar cell fabrication and, in particular, to an improved metallization method for silicon solar cells.

BACKGROUND OF THE INVENTION

In order to extract current from solar cells it is necessary to form metal contacts to both the n-type and p-type material of the device. One method frequently used for forming these metal contacts is metal plating. This is a an attractive method for forming metal contacts to solar cells because of its potential low cost and for forming narrow lines compared with that of screen-printed silver which is used for most commercially produced silicon solar cells. Electroless plating of nickel and then copper was successfully used by BP Solar in their manufacture of Saturn silicon solar cells.

Metal plating involves the reduction of metal ions from a solution to form a metal deposit on the solar cell. Typically, metal deposits are formed at cathodic sites on the cell (i.e., where there exists a source of electrons). This source of electrons can be provided by a reducing agent in the plating solution, in a process called electroless plating, or from electrons generated, at least in part, by the photovoltaic effect when a solar cell is exposed to light in a process called "light-induced plating" (LIP) or photoplating.

Typically, prior to metallization openings (e.g., grooves) are formed through a dielectric layer (silicon dioxide or silicon nitride) to expose regions of n-type silicon. The openings can be formed using laser-scribing or other patterning techniques, such as photolithography, and can involve either in-situ doping or subsequent furnace doping of the silicon exposed at the base of the grooves to result in a heavily-doped silicon region at the base of the grooves. This heavy doping at the base of the grooves enables ohmic contacts to be formed between deposited metal and the silicon. When metal plating, the patterned dielectric layer, provided it is of high enough quality, acts as a mask for the deposition of metal with metal, in ideal situations, only plating to the silicon regions exposed by the patterning process (e.g., at the base of the grooves).

However in commercial production, for cost, simplicity, throughput and the avoidance of high temperatures, such dielectric layers are often not of good enough quality to act as a plating mask, leading to unwanted localised areas of spurious plating in areas other than where required for the metal contacts. For example, a common problem encountered in the metal plating of silicon solar cells employing a silicon nitride dielectric masking layer, and in particular where the silicon nitride has been deposited by remote plasma enhanced chemical vapour deposition (PECVD), is the formation of spurious unwanted metal deposits over the dielectric layer, in addition to the metal deposited in the grooves. The phenomenon is often referred to as "ghost plating". In addition to increasing the effective shading for the solar cell, "ghost plating" is also undesirable because it can result in shunts, especially when the metallization process includes a metal sintering step to further reduce the contact resistance of the metal contacts.

To some extent the "ghost plating" problem can be solved by growing a thin (10-15 nm) silicon dioxide layer on the diffused silicon before depositing the silicon nitride layer. Although, this method can be effective in eliminating "ghost plating" it has several disadvantages. First it typically requires an additional high-temperature process which is undesirable for many lower-quality silicon substrates because increased exposure to high temperatures reduce carrier lifetimes. Furthermore, it increases the overall cost of fabrication process by the increased wafer handling. Second, it limits the extent to which the hydrogen from the silicon nitride layer can be used to passivate defects in the silicon substrate. The latter point is particularly relevant to multicrystalline wafers which exhibit many defects due to the presence of grain boundaries in the wafers. Multicrystalline wafers are popular commercial substrates due to their low-cost and so this second limitation is particularly pertinent.

SUMMARY OF THE INVENTION

According to a first aspect, the present invention consists in a method of forming contacts on a surface emitter of a silicon solar cell, the method comprising:

n-type diffusion of a surface to form a doped emitter surface layer that has a sheet resistance of 10-40 $\Omega/\square$;

etching back the emitter surface layer to increase the sheet resistance of the emitter surface layer; and selectively plating the surface.

The selective plating may be achieved by forming a plating mask and plating through the mask. Alternatively, the selective plating may be achieved by creating surface regions where plating is required which are more highly doped than the remainder of the surface and plating the surface whereby plating selectively forms on the more highly doped regions.

The etching back step may results in an emitter surface layer resistivity in the range of 100-150 $\Omega/\square$.

The emitter doping step may be achieved using a $POCl_3$ diffusion scheme in a diffusion furnace and the wafers may be placed back-to-back prior to loading them into the diffusion furnace to minimize doping of the back surfaces. The heavy front surface diffusion may be achieved in one example by:

(i) performing a of pre-oxidation diffusion for 5 mins at 890° C.; and (ii) performing a further diffusion in the presence of $POCl_3$ for 30 mins at 890° C. to achieve a 10-20 $\Omega/\square$ sheet resistance on the front surface.

The diffusion source may also be a spin-on diffusion source.

The diffusion process may produce a sheet resistance of >100 $\Omega/\square$ on the rear surface.

Preferably the diffusion is performed to achieve a uniform diffusion with <10% variation in sheet resistance across the front surface of wafers.

The etch-back process may be achieved by immersing the diffused wafers in an etchant solution. The etch-back can also be done by just spraying the etchants onto the wafer surface rather than immersion in liquid. One suitable arrangement is a Trilogy etch (126 parts nitric acid, 60 parts water and 5 parts 40% (w/v) ammonium fluoride) performed at 20° C. for 40 seconds. The etch-back process may also be achieved by performing an etch in a solution comprising potassium permanganate, water and HF. Alternatively an etching solution which preferentially etches more highly doped n-type silicon than lightly doped silicon may be used, such as a molar composition of silicon etching solutions comprising HF, nitric acid and acetic acid. In particular the etching solution may comprise 1 part HF, 50 parts nitric acid and 100 parts acetic acid.

The selective plating may be achieved by forming a plating mask and plating through the mask. Alternatively, the selective plating may be achieved by creating surface regions where plating is required which are more highly doped than the remainder of the surface and plating the surface whereby plating selectively forms on the more highly doped regions.

According to a second aspect the present invention consists in a method of fabrication of a silicon solar cell comprising:
i. performing a front surface emitter diffusion of n-type dopant to achieve a finished emitter sheet resistivity of 50-250 ohms per square;
ii. performing a dielectric deposition on the front surface by PECVD comprising:
   a. growth of a thin 5-30 nm oxide;
   b. PECVD deposition of an Anti-Reflection Coating (ARC) and hydrogen source;
iii. screen-print rear (non-light receiving) surface with aluminium for the rear contact, followed by firing;
iv. annealing the silicon to drive hydrogen from the silicon nitride layer into the silicon to passivate the silicon after the rear contact firing step (iii) at least.
v. performing a localised laser melting of the wafer top surface to simultaneously melt and dope the light receiving surface of the silicon, creating the heavily doped n+ regions in locations where front surface metal contacts are to be formed, while destroying the overlying dielectric layers to expose the doped silicon surface of the n+ regions;
vii. plating a layer of nickel over the laser doped n+ regions.

The solar cell is preferably manufactured from multicrystalline silicon.

The front surface emitter diffusion of n-type dopant is preferably performed to achieve a finished emitter sheet resistivity of 80-160 ohms per square (nominally 100 ohms per square).

The thin silicon oxide layer is preferably grown to a thickness of 10-20 nm and may be grown thermally in a belt or tube furnace. Alternatively the thin silicon oxide layer may be grown by PECVD.

The ARC and hydrogen source may comprise one or more layers of silicon nitride ($SiN_x$), aluminium oxide ($Al_2O_x$), titanium oxide ($TiO_2$) or another material with similar suitable properties. In particular the material should have a similar refractive index to $SiN_x$ (approx 2.0 in air), and can simultaneously contain significant amounts of hydrogen through the deposition process to be able to provide the atomic hydrogen source during subsequent anneals (though this might be achieved using a plurality of layers with different characteristics to achieve the combined requirement). In this way, the thin oxide would provide the surface passivation (in conjunction with the H+ through the anneal) and protect against ghost plating and reduce laser damage during the laser doping, while the overlying layer would provide the optical requirements for antireflection and the hydrogen source for the anneal. The optical thickness of the ARC needs to be effectively one quarter wavelength of the dominant light colour in sunlight which is about 600 nm (in air). It is therefore the product of the refractive index and the layer thickness that needs to be the same for the different materials. However to be a good single layer ARC, the refractive index needs to be about 2.0 (to be sandwiched between silicon and air) in which case the thickness needs to be about 75 nm. This applies to all the mentioned materials ($SiN_x$, $Al_2O_x$ and $TiO_2$ which can all be deposited with refractive index of about 2).

The ARC layer or layers preferably have a thickness of 65-75 nm and may be a single hydrogen rich layer. Alternatively the ARC layer may comprise at least two layers as follows:
i. 80-120 angstroms of hydrogen rich material;
ii. 550-650 angstroms of a material of refractive index 2.0-2.1;

The ARC will preferably comprise silicon nitride.

The anneal may be performed at a temperature in the range of 350 to 720° C. for 0.5 to 20 mins. Preferably the anneal may be performed at a temperature in the range of 350 to 500° C. for 5 to 20 mins or in the range of 500 to 720° C. for 0.5 to 8 mins and in particular it may be performed at a temperature in the range of 380 to 420° C. for 8 to 12 mins.

The laser doping of the silicon, in locations where front surface metal contacts are to be formed, may performed to achieve a junction depth in the range 0.1 to 12 microns and preferably in the range 1 to 5 microns. The laser doping of the silicon, in locations where front surface metal contacts are to be formed, may result in a localised sheet resistivity in the formed n+ regions following melting and/or evaporation of the silicon in the range 0.2 to 200 ohms per square and preferably in the range 1 to 40 ohms per square.

The nickel plated to the n+ regions may be sintered at 150-500° C. for 0.2 to 20 mins and preferably at 350-400° C. for 1-3 mins. The nickel plated to the n+ regions may also be sintered at 350 to 720° C. for 0.5 to 20 mins and preferably at 350 to 500° C. for 5 to 20 mins or 500 to 720° C. for 0.5 to 8 mins and incorporates the annealing step to passivate the silicon. In particular nickel may be sintered at 380-420° C. for 8 to 12 mins while incorporating the annealing step to passivate the silicon. This duration is longer than normally considered optimal for Nickel sintering in laser doped solar cells and will therefore lead to the nickel penetrating further into the n+ laser doped silicon and potentially to the junction region where deterioration in the electrical performance of the device can result. To avoid this, the laser doping is preferably done in a way where the junction between the n+ laser-doped silicon and the p-type wafer is deeper, such as can be achieved with a laser that keeps the silicon molten for longer such as a cw laser. In particular, the junction needs to be at least 2 microns deep and preferably in the range of 4 to 10 microns to accommodate these combined annealing/sintering conditions.

The firing of the rear screen printed contact may be performed in a belt furnace and may be performed at temperatures in the range of 650-1,000° C. The firing of the rear screen printed contact will preferably be performed at 800-880° C.

The solar cell is preferably formed on a p-type wafer and an Isotropic texturing step may be performed on the front (or light receiving) surface of the p-type wafer prior to performing the front surface emitter diffusion Preferably a step to perform a rear surface etch/edge junction isolation/psg removal from front surface occurs after the emitter diffusion step.

Prior to the laser doping step, a dopant containing source may be formed on the top surface over the oxide and silicon nitride layers. Alternatively the dopant source may be supplied to the top surface over the oxide and silicon nitride layers during the laser doping step. The dopant source preferably comprises a phosphorus source. The dopant source may be supplied to the top surface in a gaseous state or a liquid state during the laser doping step.

In one embodiment, the dopant source may be supplied to the top surface over the oxide and silicon nitride layers as a liquid jet through which a laser beam is directed onto the top surface during the laser doping step. The liquid jet may be generated by the nozzle unit into which the laser beam is coupled such that it may be guided by total internal reflection within the liquid jet towards the target. The liquid jet may comprise phosphoric acid.

A dilute HF dip is preferably performed to remove any oxide or other surface layer on the heavily phosphorus doped silicon after the laser doping step.

The Nickel plating over the laser doped n+ regions, for the front surface contacts; may be performed to provide an nickel thickness in the range of 0.01 microns to 10 microns but preferably in the range 0.1 to 1 microns.

Plated layers of Copper and Tin (or Silver) may be formed over the Nickel.

The layers of copper and tin (or silver) may be plated over the nickel plating to a thickness in the range of 1 microns to 25 microns but preferably in the range 5 to 15 microns (nominally 8 microns). A thin silver layer may then be plated over the other metal layers to cap and protect the copper and tin layers. The silver plating may have a thickness in the range of 0.005 microns to 1 microns but preferably in the range 0.01 to 0.1 microns (note, the copper and or tin can be eliminated and replaced by a Silver layer of the same dimensions as the copper and or tin layer it replaces).

BRIEF DESCRIPTION OF THE DRAWINGS

Embodiments of the invention will now be described, by way of example, with reference to the accompanying drawings in which.

DETAILED DESCRIPTION OF EMBODIMENTS

Figure 1:
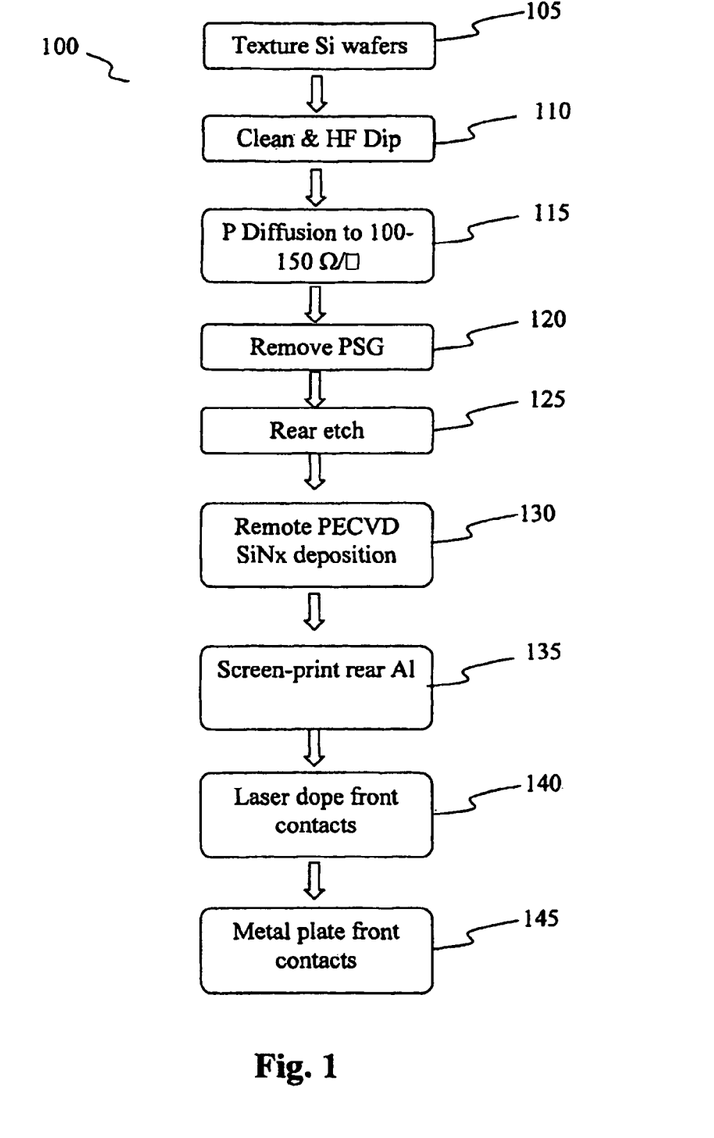
FIG. 1 is a flow chart showing the process that results in spurious unwanted metal being deposited on the silicon nitride surface during metal plating of cells.

FIG. 1 depicts a process for fabricating laser-doped p-type silicon solar cells. This process has been developed with a view to fabricating silicon solar cells which demonstrate higher efficiencies than the current industry-standard screen-printed cells but at a comparable cost per unit area. These cells are characterized by a shallow, lightly-doped n-type emitter which improves the cell's blue-light response from that of a standard industrial screen-printed solar cell. The fabrication process 100 employs metal plating to form the front metal contacts and would benefit from advances that eliminate "ghost plating" that occurs during the metal plating step. The steps of the fabrication process 100 are first described and then compared with the fabrication process of the preferred arrangement 200 (see FIG. 2), in which the occurrence of, "ghost plating" has been eliminated.

Figure 3:
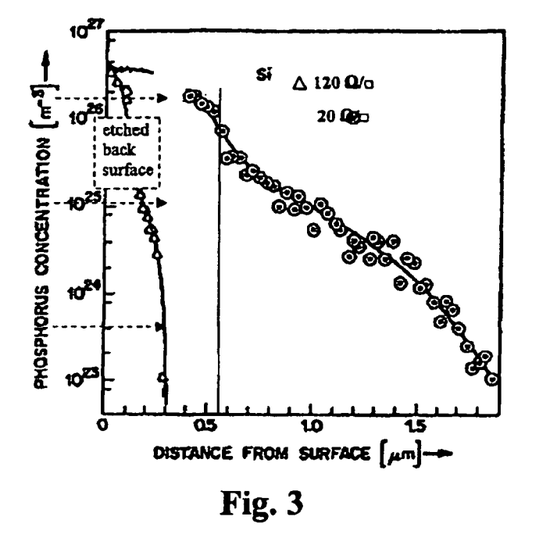
FIG. 3 compares the doping profiles of the shallow, lightly-diffused emitter (that results from the process depicted in FIG. 1) with that obtained from the deeper, more heavily-diffused emitter (that results from the process depicted in FIG. 2)

The fabrication process 100 comprises a texturing step 105 which involves the formation of a texture on the wafer surfaces to reduce surface reflection and enhance light trapping inside the cell. Typically, alkali texturing is used for mono-crystalline wafers and acid texturing for multi-crystalline wafers. After texturing, in step 110 the wafers are cleaned and then immersed in a 5% hydrofluoric acid (HF) solution to remove any native oxide that may have formed on the silicon surfaces. In step 115, an n-type emitter is formed on the front surface such as by using a standard $POCl_3$ furnace diffusion or diffusion from a spin-on or spray-on diffusion source such as phosphoric acid. In order to maximize the blue-light response of the cells, it is desirable to diffuse less phosphorus into the surface of the silicon during the emitter formation compared to screen-printed cells to achieve a sheet resistance of 100-150 $\Omega/\square$. Such commercial emitter diffusion processes, despite the much higher sheet resistivity compared to screen-printed cells, still have surface phosphorus doping concentrations similar to those for screen-printed solar cells in the vicinity of the solid solubility of phosphorus in the silicon at the diffusion temperature such as shown in FIG. 3. The junction depths though are significantly less.

After the diffusion, in step 120 the cells are then immersed in a 2.5% HF solution to remove the phosphosilicate glass (PSG) or dopant source that remains on the surface after the diffusion. The rear surface is then etched back in step 125 to remove any unwanted diffusion on the rear surface and also to isolate the junction at the edges.

The silicon nitride dielectric layer is then deposited in step 130. Typically in industrial environments this deposition is done using remote PECVD at a temperature of 400° C. to result in a final layer of thickness about 75 nm and refractive index of about 2.0. In addition, to acting as an antireflection coating for the cells, the silicon nitride also serves to passivate the underlying silicon thus enabling higher cell voltages.

The rear surface electrode is formed by screen printing an aluminium paste on the rear surface of the cell in step 135. The cells are then typically fired in a belt furnace at a temperature of 800° C. for less than a minute. This firing treatment is above the aluminium/silicon eutectic temperature and therefore results in aluminium diffusing into the molten silicon to form a more heavily doped p+ layer which acts as a back-surface-field.

Front metal contacts can then be formed by using a laser to simultaneously scribe and heavily-dope openings in the front dielectric silicon nitride layer. This process, in step 140, is referred to as laser-doping and is typically achieved by coating the silicon nitride surface with a surface layer of phosphorous dopant (e.g., phosphoric acid) before using the laser to scribe the openings. In this process, the heat from the laser locally melts the silicon and enables the phosphorous atoms to diffuse into the silicon before it re-solidifies. Using this technique, regions typically doped to a sheet resistance of 10-20 Ω/□ can be formed in the base of the grooves thus enabling ohmic contacts with low contact resistance to be formed between the silicon and the metal.

Clearly simultaneous heavy doping and scribing can also be performed using other techniques, such as liquid chemical processing (LCP) as described in [D. Kray et al., Laser Chemical Processing (LCP)—A versatile tool for microstructuring applications, *Appl. Phys. A.* 93, 99-103 (2008)]. Also, an equivalent process that involves first etching or scribing the openings in the silicon nitride layer and then achieving the heavy doping at the base of the grooves by performing an additional heavy diffusion step with the silicon nitride acting as a mask for the heavy diffusion that limits the phosphorous dopant atoms to just the area exposed in the base of the grooves. The latter process was employed by BP Solar in their manufacture of Saturn cells, however in this case they used low pressure CVD instead of the more commonly-used PECVD process.

The final step of this fabrication process 145 involves the plating of metal to the exposed regions at the base of the grooves. The plating can be achieved using electroless, electroplating or light-induced metal plating. A number of different metal combinations can be used, bin perhaps the most attractive combination from the perspective of reduced cost is the use of a thin layer of nickel to form a barrier layer with a thicker layer of copper being deposited to form highly-conductive fingers which are capable of the carrying the current from the solar cell to an electrical connection. Preferably, the nickel layer is sintered to form a nickel silicide layer which further reduces the contact resistance of the metal silicon interface. This sintering process can either be performed after the nickel deposition step and before the copper is deposited or after the copper deposition process.

A considerable problem that is experienced with the use of the fabrication process 100 is that of spurious unwanted plating of the metal to regions of the silicon nitride surface other than the grooves. This spurious plating is observed when using either electroless plating or LIP processes in the metal plating step 145. This phenomenon has been referred to as "ghost plating" and is undesirable because of the increased shading (due to the unwanted metal deposits) but also possible shunting that can occur when nickel can permeate the shallow p-n junction of the non-groove areas during the heating associated with the formation of a silicide.

A new process will now be described which can ameliorate the problem of "ghost plating", whilst potentially simultaneously avoiding the need for a separate edge junction isolation process and whilst retaining all the other attractive aspects of the above-described fabrication process 100. It has been enabled by a fundamental understanding of the cause of the "ghost plating" to be due to a high surface concentration of (phosphorous) dopants in the diffused silicon (i.e., after step 110 in process 100). This high concentration of phosphorous dopants appears to be unaffected by the PSG removal step 115 and therefore, in the absence of a high quality dielectric masking layer attracts unwanted or spurious metal deposition during metal plating processes. This problem has been addressed in the preferred arrangement of this invention which is depicted by fabrication process 200 in FIG. 2.

Figure 2:
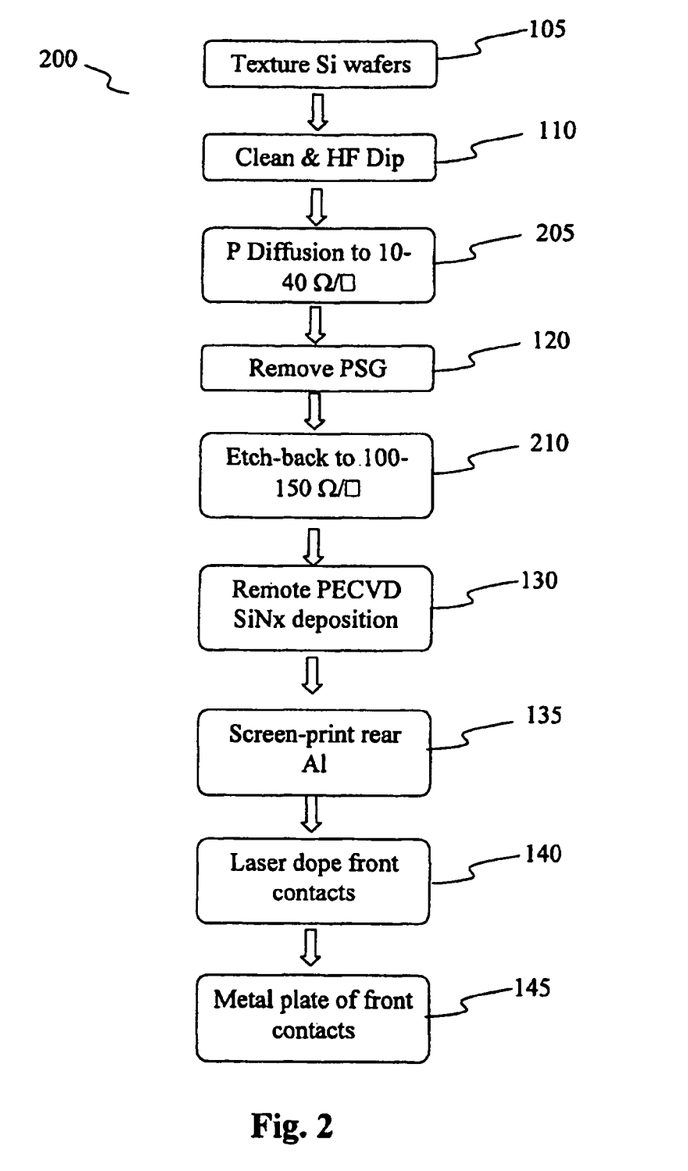
FIG. 2 is a flow chart showing the process of the preferred arrangement of the invention that eliminates the deposition of spurious unwanted plating on the silicon nitride surface during metal plating of cells.

The fabrication process 200 is essentially the same as process 100 with the exception of steps 115 and 125 which are replaced by steps 205 and 210, respectively. In step 205 the phosphorous diffusion process is altered to result in amore deeply doped emitter top surface layer that has a final sheet resistance of 10-40 Ω/□ rather than the 100-150 Ω/□ emitter that is formed in step 115 of process 100. This is achieved using a POCl$_3$ diffusion scheme by placing the wafers back-to-back prior to loading them into the diffusion furnace to restrict the amount of phosphorus able to get to the rear surface of the wafers compared to the fronts. For spin-on diffusion sources, the rear surfaces naturally receive less phosphorus, leading to significantly higher sheet resistivities, with shallower junction depth compared to the front surface. The heavy front surface diffusion using a POCl$_3$ diffusion scheme preferably involves:

(i) 5 mins at 890° C. of pre-oxidation diffusion (to form a base layer in which the P$_2$O$_5$ dopant can diffuse); and (ii) 30 mins at 890° C. in the presence of POCl$_3$ to achieve the preferred 10-20 Ω/□ sheet resistance on the front surface and typically >100 Ω/□ on the rear surface. Preferably, a uniform diffusion with <10% variation in sheet resistance across the front surface of wafers is performed. This diffusion scheme results in doping profile for phosphorus as shown in FIG. 3 where it is compared with the shallower profile that is obtained using step 115 of process 100. In the case of step 205 the junction is now located more than 1.5 μm from the surface, as compared to the junction depth of ~0.3 μm that results with the shallower diffusion of step 115. In both cases, however the phosphorus concentration at the surface is similar and between $10^{26}$ and $10^{27}$ m$^{-3}$.

In the diffusion process, as the dopant concentration is raised above $10^{-3}$, a "kink" starts to appear in the doping profile and the tail of the profile extends deeper into the substrate as the surface concentration is raised higher. This corresponds to an apparent increase in the diffusion coefficient despite a constant diffusion time and temperature. This phenomenon is also known as the "emitter (or phosphorus)-push effect". This effect can be utilized to obtain a deep junction on the front surface of the wafer, while a shallower junction can result on the rear surface by restricting the phosphorus access to the rear surface by either only applying the dopants to the front surface or else locating wafers back-to-back with an adjacent wafer and thereby keeping the phosphorus concentration within the silicon at a low enough value to avoid the enhanced diffusion coefficients that result from the "emitter push effect".

In step 210 an etch-back process is performed to remove a surface layer from the heavily-diffused silicon surface. As shown in FIG. 3, this etch back process can be optimized such that the final sheet resistance is 100-150 Ω/□ (i.e., as desired for a lightly-doped emitter). However, unlike the dopant profile that results from the diffusion step 115 of process 100, the new dopant profile of the etched-back surface has a significantly lower surface concentration of phosphorous dopants (i.e., <$10^{26}$ m$^{-3}$). Furthermore, the etch-back process (step 210) also etches the rear surface to remove unwanted dopants from that surface and achieves edge isolation by removing almost all such dopants from the rear due to the shallower junction compared to the front. These processes were performed as part of step 125 in fabrication process 100.

In the preferred arrangement the etch-back process is achieved by immersing the diffused wafers in a Trilogy etch (126 parts nitric acid, 60 parts water and 5 parts 40% (w/v) ammonium fluoride) at 20° C. for 40 seconds. The etch rate for (100) silicon is quoted to be 150 nm/min (K. R. Williams, "Etch Rates for Micromachining Processing—Part II", Journal of Microelectromechanical System, Vol. 12, No. 6, pp. 761778, 2003). It is desirable to use etching solutions which etch crystalline silicon relatively slowly to ensure that accurate timing of the etch-back process is possible. If necessary the etching rate can be further reduced by performing the etch-back at temperatures <20° C.

Alternatively the etch-back can be performed in other isotropic silicon etching solutions, such as solutions comprising potassium permanganate, water and HF, which etch silicon more slowly. However, although this enables the etching time to be more carefully controlled, in many places in the world disposal of permanganate can be problematic.

In further alternative arrangements, etching solutions which preferentially etch more highly doped n-type silicon than lightly doped silicon can be used. For example, it is known that the molar compositions of silicon etching solutions comprising HF, nitric acid and acetic acid can be varied to adjust the etch rate and also selectivity to dopant level. U.S. Pat. No. 4,681,657, granted to Hwang et al., describe the use of such a solution comprising 1 part HF, 50 parts nitric acid and 100 parts acetic acid that etches highly doped silicon 25 times faster than lightly doped silicon. This composition shows a sharp increase in etch rate when the dopant level is greater than $10^{25}$ min$^{-3}$. Furthermore, this solution's etching rate for highly-doped silicon is only 44 nm/min making the etch-back process easier to control.

Although the use of such selective etchants provides more controllable etch back and guaranteed removal of all the most heavily doped silicon from the regions where plating is to be avoided, this approach however fails to remove any unwanted phosphorus diffusion into the rear surface of the wafer, and therefore may still necessitate a separate edge junction isolation process. Alternatively, the etch-back process can include a first etching step which only etches lightly (or un-doped) silicon, leaving the heavily-doped front surface untouched. When the rear-surface doping has been removed then the abovementioned preferential etch for heavily-doped regions can be used to more controllably etch back the front surface. Alkaline anisotropic etches can be used in the etching step as heavily-doped regions tend to passivate quickly in these solutions and therefore are protected from the action of these etchants.

After the etch-back step 210 the remaining steps of the fabrication process 100 are performed with the only required difference in the procedure being a slight increase in the PECVD time required to achieve a silicon nitride layer of the same thickness as achieved in process 100. The lower surface concentration of dopants, provided it is at least a factor of two below the laser doped (or other) region to be metalized, appears to alleviate the need for a high quality masking layer for the LIP process, making it feasible to use standard PECVD of silicon nitride or other suitable low cost antireflection coating layer such as titanium dioxide, for both antireflection coating and plating mask. To ensure the phosphorus surface concentration differential of at least a factor of two (and preferably at least a factor of 10) is achieved between the regions to be plated compared to those needing to avoid plating, deeper junctions than the typical 1 micron deep junctions typically formed in the laser doped regions are desirable. A continuous wave laser has been found particularly effective at achieving such deeper junctions while simultaneously retaining the very high phosphorus concentrations, with depths in the range of 1 to 20 microns demonstrated. Such deeper laser doped junctions therefore make it easier to get greater variation in the surface doping concentration by etching away more silicon, therefore providing greater protection against spurious plating to the lighter doped surface regions. In addition, the greater the variation in the surface doping concentration, the lower the quality of the masking layer that can be tolerated such that in the extreme, sufficient variation can facilitate localized plating to the heavily doped laser doped regions without even requiring any masking layer for the lightly doped regions. At the other extreme, with a high enough quality masking layer such as provided by high temperature thermal oxidation of the silicon or high temperature CVD such as of silicon nitride, virtually no concentration variation is required between the exposed regions to be plated and those that are masked and therefore not to be plated. A further factor that can be used to reduce the required surface concentration variation for a given masking layer quality is increasing the surface roughness of the region to be plated. This can be done as part of the laser doping process or as a subsequent chemical or mechanical process applied to the exposed silicon surfaces to be plated. For example, following the laser doping process for the regions to be plated, provided the depth of the junction is deep enough, a texturing solution can be used to roughen the surface to enhance both its ability to be plated relative to smoother surfaces as well as improving the adhesion of the subsequent metal to the silicon surface in such regions.

As will be appreciated by someone skilled in the art, for a given antireflection coating (surface dielectric) masking quality, there are a range of approaches that can be used to achieve the required variation in surface doping concentration necessary to prevent the masked areas from being plated while ensuring the unmasked areas are plated as required. Another example of such an approach is to diffuse the emitter dopants through an already patterned mask such that the masking layer restricts the phosphorus penetrating into the silicon in such regions, reducing both the amount of phosphorus and the surface phosphorus concentration relative to the unmasked regions that are to be metalized.

In another implementation of this general approach, the heavy doping of regions to be metalized (such laser doping or alternative method) can be carried out prior to application of the antireflection coating. In this case if the antireflection coating layer is of too high a quality in terms of its masking abilities, then no LIP plating will take place. However, with a layer of poorer masking qualities as would be normally expected from low cost, high throughout commercial processes, the heavily doped regions intermittently plate during the LIP process while the variation in surface doping concentration leads to the avoidance of spurious plating to the regions with lower surface concentration. Such a strategy can be of benefit when there is a preference to reduce the metal/silicon interface area. Additional plating time can then be used to facilitate plating across the dielectric surface to allow the localized dots of plating to join up to produce continuous lines of plated metal above the heavily doped regions if desired.

In another implementation of this general approach, the conductivity of the preferred regions for plating can be enhanced by a range of techniques rather than by using techniques such as an etch-back of the regions not to be plated so as to reduce their conductivity. For example, regions to be plated could be coated by conductive inks or pastes that could comprise a range of conductive materials or particles such as highly doped silicon particles or even metal particles. Such printed or deposited layers often require a heat treatment to achieve best electrical properties, following which their conductivity exceeds that of the rest of the doped surface of the semiconductor, therefore facilitating plating selectively to the more conductive regions either with or without a masking layer.

In the preferred arrangement described in FIGS. 2, the metal plating step 145 is performed by LIP of nickel, followed by a nickel sinter step at 350° C. for 5 minutes, and then a final LIP of copper. In these plating operations, the wafers are immersed in plating, solutions comprising a source of nickel and copper ions, respectively. The rear aluminium surface of the cell is electrically connected to a separate anode comprising the metal being plated. Care is taken to ensure that the depth of the solution between the light source and the wafer was restricted to ≤1 cm in order to reduce the amount of light absorbed by the solutions before reaching the solar cell surface. The plated copper surface of the metal contact is then preferably protected from environmental oxidation by a final treatment in immersion silver. Alternatively, electroless plating or electroplating, or combinations of electro- and LIP processes can be used to form the metal contacts without any observable "ghost plating" on the silicon nitride layer.

The key to this method is reducing the surface concentration of dopants in the diffused silicon before depositing the silicon nitride or other commercially viable antireflection layer. An alternative way of achieving this reduced surface concentration of dopants involves increasing the duration of the pre-oxidation step. The thicker silicon dioxide layer that results, slows down the rate at which phosphorus dopants enter the silicon substrate while giving time for dopants that have already diffused into the silicon to diffuse further.

Figure 4:
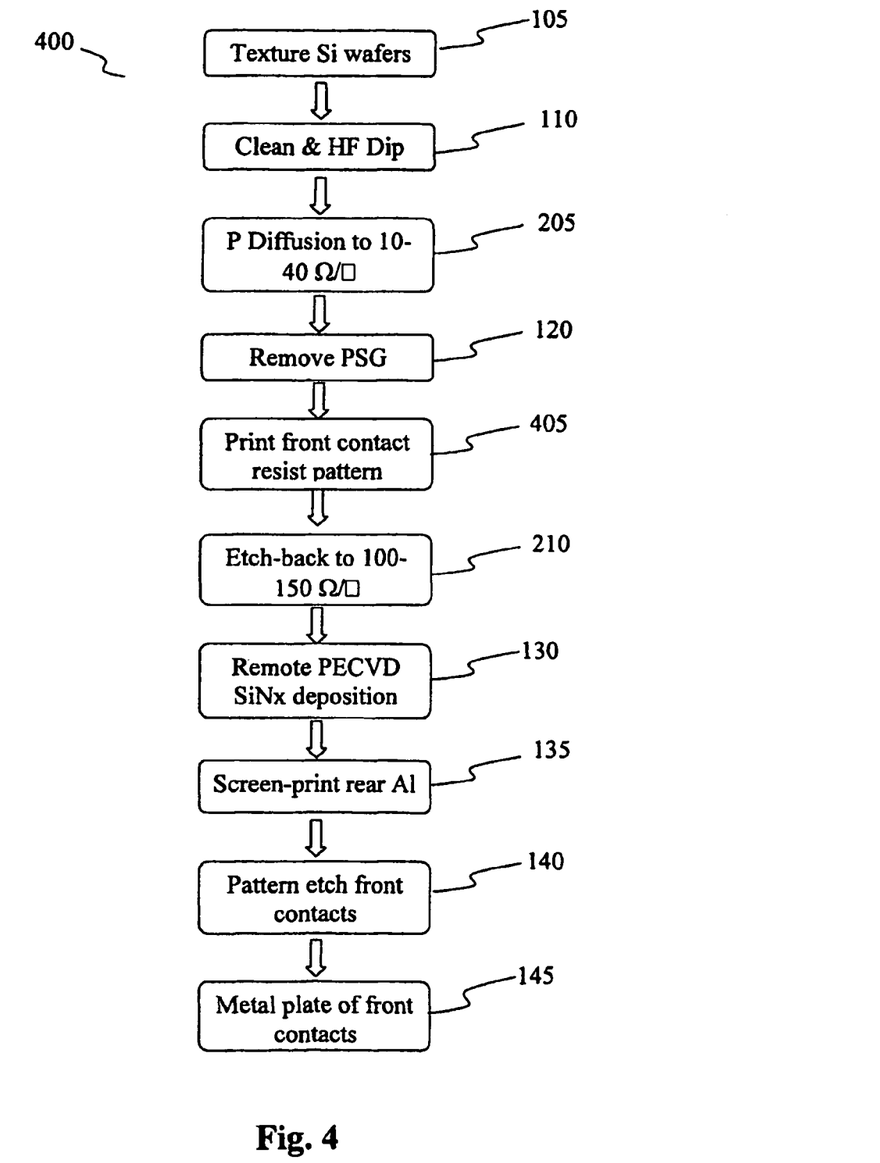
FIG. 4 is a flow chart showing an alternative embodiment of the invention used to form a selective-emitter cell structure.

The present method can also be used advantageously to fabricate selective-emitter solar cells that do not require a second doping step. Instead of using a laser to simultaneously scribe openings in the silicon nitride layer and heavily-dope the silicon that is exposed at the base of these openings, a fluid deposition device can be used to first print a resist pattern on the heavily-doped front surface that results from step 205 in fabrication process 200, thus protecting these regions from the etch-back process in step 210. Then rather than use a laser to form the openings through the silicon nitride layer in step 140 in fabrication process 200, a fluid deposition device is used to etch openings in the silicon nitride layer that align with the highly-doped regions of silicon. This fabrication process 400 is shown in FIG. 4. The only variations from process 200 are (i) the insertion of step 405 which involves the deposition of a resist pattern on the silicon surface before the etch back process in step 205; and (ii) the replacement of the laser-doping step 140 with a patterned etching step 410. Steps 405 and 410 will now be described in more detail.

In order to retain highly-doped regions from the initial diffusion process in step 205 only at the regions where front-contact openings will be formed a resist material is deposited on the highly-doped surface in a pattern corresponding to the pattern of openings. The resist material is preferably a silicon dioxide solar resist material, such as the inkjet printable isishape "SolarResist™", as provided by Merck Chemical, but other spin-on-glass materials can also be used. An advantage of the preferably-used "SolarResist" material is that it can be tempered in air and therefore does not require a heat treatment in order to provide resistance to chemical etchants. Preferably the thickness of the deposited "SolarResist" material is 50-150 nm and more preferably ~100 nm.

Alternatively, polymer acid resist materials can also be used (e.g., novolac resins, polymethylmethacrylic acid, etc.), however these resist materials typically require both a heating step to cure the polymer and a stripping process. Furthermore, they risk the introduction of organic residues onto the surface before the silicon nitride deposition step.

Preferably, the "SolarResist" material is removed after the etch-back step 210 by immersion of the wafers in a solution comprising 50% 7:1 buffered oxide etch and 50% deionised water for 2-4 minutes, with the actual time depending of the final thickness of the deposited resist material. Alternatively, the resist material can be retained and although it will affect the properties of the silicon nitride deposited over those regions, it can also assist in visually differentiating the heavily-doped regions from the lightly-doped regions at the patterned etching step 410.

The deposition of the resist material is preferably achieved using an aerosol jet printer, such as provided by Optomec, Inc. This deposition process results in deposits which can be very low in solvent content because of the dehydration of the aerosol particles, and therefore not require additional heating processes to eliminate solvent. However, clearly other deposition devices such as inkjet printers can also be used. Preferably the resist pattern uses dimensions (e.g., line widths) that are slightly larger than the anticipated openings for the metal contacts because the etch-back process in step 210 will result in some undercut etching below the edges of the resist.

Then in step 410, a pattern of openings for the metallization are then etched in the silicon nitride. This etching process can be easily aligned with the heavily-doped areas because the silicon nitride which is deposited over the heavily-doped areas is visually evident and alignment between heavily-doped regions and the etching pattern can be readily achieved using a camera integrated in the fluid deposition device. The method used to etch the openings (e.g., grooves) into the dielectric layer is described in WO/2009/094711 "Method of Patterned Etching of Selected Material" hereby incorporated by reference. The thus-patterned grooves can then be metalized as described for step 145 in fabrication process 200.

An alternative method of minimizing, with a view to eliminating, the presence of "ghost plating" is to exploit the properties of the metal plating process to minimize the likelihood of the spurious plating. The formation of metal deposits by the reduction of metal ions in a plating solution is driven by the potential at the silicon surface. Although this potential is largely due to the electrochemical potential over the cell in LIP, the surface potential also depends on properties of the interface. The rate of an electrochemical reaction, such as the reduction of metal ions at the cathodic regions of the front surface, depends on the overpotential of the reaction. There are many sources of overpotential, and all sources contribute to the cathode having to be more negative than the potential theoretically required to drive the reduction reaction.

Contributing sources of overpotential (for metal deposition in the front-contact grooves) include concentration and resistance factors. These sources of overpotential are reduced for more heavily-doped silicon surfaces. Simply put, the higher concentrations of electrons in the more-heavily doped silicon regions result in a reduced overpotential due to increased current flow. Furthermore, the more highly-doped regions provide a more charged surface that attracts more strongly the metal ions from the plating solution, thus increasing the rate at which the reduction reaction can occur.

It is observed that if the overpotential at the silicon interface at the base of the grooves is reduced then "ghost plating" can be minimized, and in some cases also eliminated. For example, it has been found that if metal is deposited (e.g., by screen printing) into the base of the grooves to make the interface more conductive, then "ghost plating" is not observed during subsequent metal plating steps. Similarly, the amount of "ghost plating" that is observed can be reduced by increasing the dopant density in the silicon regions at the base of the grooves. This can be achieved in the fabrication process 200 by adjusting the parameters of the laser doping process, such as the laser speed, to increase the dopant density at the surface and to reduce the sheet resistance of interface silicon.

This approach to minimizing "ghost plating" is not limited to LIP. Electroless plating solutions are typically optimized according to a requirement to plate onto silicon having specific doping characteristics. For example, often chelating agents are used to effectively control metal ion concentrations so that plating can be achieved on both p-type and n-type silicon surfaces. Clearly, these solutions could be further optimized with respect to chemical composition to only plate onto highly-doped n-type surfaces thus minimizing spurious plating.

Embodiments of this invention represent a significant advantage to commercial solar cell fabrication because by solving the "ghost plating" problem in a way that does not incorporate significant further costs (in terms of materials and extra processes) or result in any reductions in cell performance, it enables a low-cost metallization scheme to be employed for a new generation of solar cells that have the potential to achieve significantly higher commercial efficiencies than screen printed cells that represent the current industry standard.

Multilayer ARC and Thermal Mismatch Correction

Embodiments of solar cell manufacturing processes employing a multiple layer dielectric which functions as an ARC and achieves thermal mismatch correction and ghost plating avoidance for a high efficiency commercial solar cell are described below in which the multiple layer dielectric can be deposited in a single process (using a single piece of equipment) or alternatively the first layer can be formed by a simple thermal process and the remaining layers can be formed by the single piece of equipment.

The approach adopted is to use a double or triple layer ARC that can be deposited in a single in-line PECVD, E-beam or sputtering deposition process. The first very thin layer is a thermal mismatch correction layer and need only be thick enough to be continuous and is expected to be in the range of about 50 to 300 angstroms thickness. The thermal mismatch correction layer provides a thermal expansion coefficient less than the silicon semiconductor material being processed to ensure the semiconductor surface is placed under compression rather than tension when at elevated temperatures. This provides relief from the thermal expansion mismatch which would otherwise be created between the ARC and the semiconductor material, and which leads to defect generation at elevated temperatures due to the semiconductor surface being placed under tension by the overlying ARC. Importantly, the thickness of this first layer needs to be thin enough so as to not have significant impact optically and to avoid excessive impedance of hydrogen passing through it from the overlying hydrogen source during surface passivation of the semiconductor material. The second layer provides the hydrogen source for subsequent surface passivation of the semiconductor material. This layer may not have an optimum refractive index to act as an ARC but is sufficiently thin to avoid detrimental effects (e.g. 80-120 angstroms of silicon nitride, aluminium oxide or titanium oxide). The third and by far the thickest layer is a material such as silicon nitride, aluminium oxide or titanium oxide deposited with the right thickness and refractive index to provide the required antireflection optical properties for the ARC.

In an alternative simplified arrangement the second layer may be omitted and the third layer can be arranged to provide the hydrogen source for the subsequent passivation step.

By way of example, when the semiconductor material from which a device is fabricated is crystalline silicon, this material is known to easily sustain defects when the surface is under tension, particularly if at elevated temperature. Silicon nitride, aluminium oxide or titanium oxide, deposited by plasma enhanced chemical vapour deposition (PECVD), is known to do a good job passivating the silicon surface, bulk and grain boundaries, primarily due to the high concentration of atomic hydrogen present in the deposited silicon nitride that is able to tie up dangling bonds at the silicon surface, defects or grain boundaries. A thin layer of PECVD silicon nitride in the range of 10-200 angstroms thick is therefore a good choice for the second layer when the semiconductor is crystalline silicon.

A good choice for the first layer in this example would be silicon dioxide (or silicon oxynitride) since these have a thermal expansion coefficient less than that of silicon and can also be deposited by PECVD by appropriately varying the gases and their flow rates. The thickness of this layer is quite important. If too thick it excessively degrades the optical properties of the overall ARC since its refractive index is not well suited to the requirements of the ARC. If too thin, the layer is unable to compensate for the stress created on the silicon surface by the overlying third layer of the ARC which is significantly thicker. This second layer is generally at least as thick as the second layer (if it exists) but not as thick as the third layer. With PECVD it is possible to tailor this layer in terms of having a graded composition and refractive index to further aid with the optimisation. The inclusion of some nitrogen allows silicon oxynitrides of virtually any refractive index from below 1.5 to above 2 to be achieved.

A good choice for the third layer is PECVD silicon nitride which can be deposited in the same equipment and process as the first two layers. It has close to an ideal refractive index, while the thickness is chosen in conjunction with the thicknesses of the first two layers to overall give the best anti-reflection properties. Typical thicknesses of the three layers are:
  i. 180 angstroms for the first layer with refractive index of 1.5-1.6;
  ii. 100 angstroms for the second layer with refractive index of 2.0; and
  iii. 600 angstroms for the third layer with refractive index of 2.0.

The overall reflection for this multi layer ARC is almost identical to an ideal SLARC with only about a 1% increase in reflection.

Alternatively the second and third layers can be combined into a single silicon nitride layer. Aluminium oxide or titanium oxide may be substituted for one or other of the layers of silicon nitride in the examples above.

By way of example, and with reference to FIG. 5, a suitable solar cell fabrication sequence for the formation of a silicon solar cell is as follows:
  1. Isotropic texturing 12 of the front (or light receiving) surface of the p-type wafer 11;
  2. front surface emitter diffusion of n-type dopant 13. The emitter diffusion to achieve an emitter sheet resistivity of 50-250 ohms per square using either tube or belt furnace. The emitter diffusion in finished will preferably be 80-160 ohms per square (notionally 100 ohms per square but note that the emitter sheet resistivity immediately following the emitter diffusion may vary from the fatal value due to changes that occur during processing such as slight etching back of the emitter surface which raises the sheet resistivity)

3. rear surface etch/edge junction isolation/psg removal from front surface;
4. ARC deposition on the front surface by PECVD;
   a. thin 5-30 nm thermal oxide growth by belt or tube furnace. The oxide layer is preferably grown to 10-20 nm using an oxide growth temperature of 750-1050° C., but preferably 900-950° C.;
   b. PECVD deposition of silicon nitride to achieve a silicon nitride thickness 65-75 nm. The SiNx layer may be a single hydrogen rich layer or may comprise at least two layers (but may be further subdivided for additional functionality) as follows:
      i. 80-120 angstroms (nominally 100 angstroms) of hydrogen rich silicon nitride specifically for surface passivation 14;
      ii. 550-650 angstroms of silicon nitride 16 of refractive index 2.0-2.1;
5. screen-print rear (non-light receiving) surface with aluminium for the rear contact 18, followed by belt furnace firing at 650-1,000° C. but preferably at 800-880° C. to sinter rear contacts 18 and form back surface field 19 by formation of aluminium/silicon alloy and liquid phase epitaxy;
6. formation of a dopant containing layer 17 (i.e. phosphorus source) onto top surface;
7. anneal the cell to drive hydrogen from the silicon nitride ARC into the silicon to passivate the silicon and repair damage caused by the firing in step 5. above. A commonly used anneal would be 400° C. for 10 mins, however the useful range is 350 to 720° C. and for 0.5 to 20 mins. This step can be performed at any stage after step 6 and can for example be achieved by extending the nickel sintering step below.
8. localised laser melting of the wafer top surface to simultaneously melt and dope the light receiving surface of the silicon, creating the heavily doped. (n+) regions 22 for formation of self-aligned front surface metal contacts, while destroying the overlying dielectric layers to expose the doped silicon surface in preparation for self aligned metal plating process. The laser doping of the silicon (using the externally applied dopant source) is performed to achieve a junction depth in the range 0.1 to 12 microns and preferably in the range 1 to 5 microns with a corresponding localised sheet-resistivity following melting and/or evaporation of the silicon in the range 0.2 to 200 ohms per square and preferably in the range 1 to 40 ohms per square;
9. a dilute HF dip is performed to remove any oxide or other surface layer on the heavily phosphorus doped silicon;
10. plating a layer of Nickel 23 over the laser doped n+ regions 22 for the front surface contacts. The Ni plating is performed to provide an Ni thickness in the range of 0.01 microns to 10 microns but preferably in the range 0.1 to 1 microns
11. sintering of Nickel 23. The sintering step is performed at 150-500° C. and preferably in the range 350-400° C. for 0.2 to 20 minutes and preferably for 1-3 minutes. This step can be extended to simultaneously provide the annealing step 7.
12. plating of layers of Copper 24 and Tin 25 (or Silver) over the Nickel 23;
13. Cu plating of the laser doped lines to a thickness in the range of 1 microns to 25 microns but preferably in the range 5 to 15 microns (nominally 8 microns)
14 thin silver plating to cap and protect the copper layer. The silver plating forms a capping layer with a thickness in the range of 0.005 microns to 1 microns but preferably in the range 0.01 to 0.1 microns (note, Cu can be eliminated and replaced by a Ag layer of the same dimensions as the Cu layer it replaces)

Figure 5:
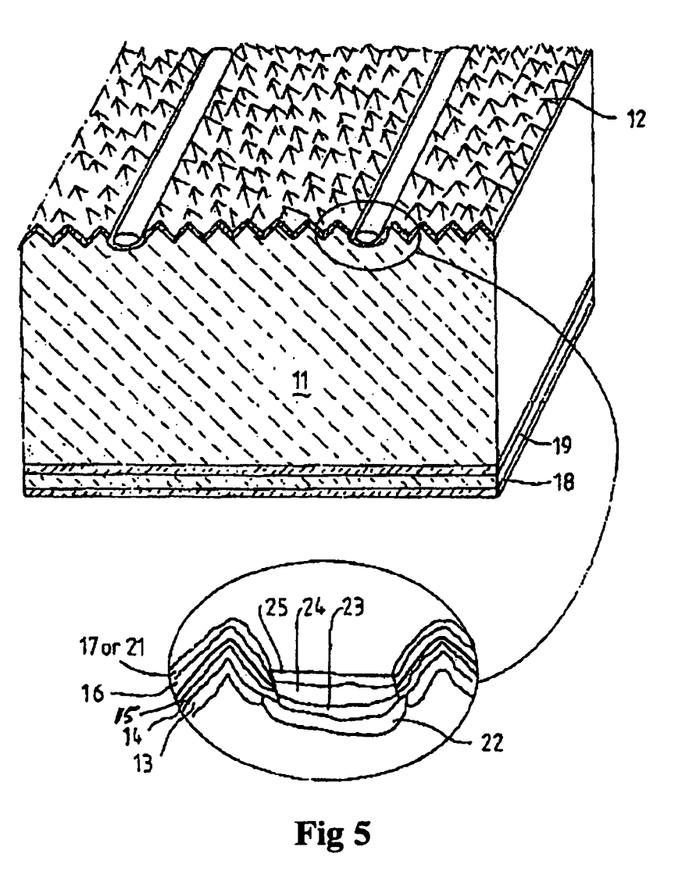
FIG. 5 illustrates a Solar cell with a selective emitter structure and metal contact formed in self-aligned method following the laser doping of the heavily doped regions beneath the metal contact. The manufacture of this solar cell may also incorporate one of the improved laser operation methods described herein.

The above sequence is particularly useful with multicrystalline cells although it can also be used with monocrystalline cells and produces the high performance solar cell structure of FIG. 5 with a selective emitter that provides heavy doping of the silicon directly beneath the metal contacts. A controlled laser heating method may be used in conjunction with this manufacturing sequence to reduce the formation of defects in the region of the contacts.

Improved heating regimes can be effected by a uniquely designed laser Q-switching arrangement or by a scanning continuous wave laser with appropriate power level, to melt the silicon for adequate duration to facilitate dopant mixing while simultaneously avoiding unnecessary thermal cycling of the melted regions or ablation of the doped silicon. Q-switched laser systems or directly applied continuous wave lasers operated in the conventional manner are unable to heat and melt the silicon in the required way.

By keeping the oxide layer thin enough so as not to act as too severe a barrier to the passage of atomic hydrogen from the overlying hydrogen source layer into the silicon to passivate the grain boundaries, the issues relating to the use of an oxide layer can be largely overcome.

Such a thin thermally grown oxide would normally never be used in conjunction with multi wafers because it blocks/retards the atomic H from getting through to passivate the crystallographic defects and grain boundaries, however using the sequence described above this difficulty can be overcome.

The use of the thin oxide is also important in multicrystalline silicon for stopping ghost plating in the emitter metallization steps as such wafers usually have different type of texturing with holes in the that are hard to coat properly with silicon nitride and are therefore more prone to ghost plating.

The use of a thermal oxide (normally grown in the range of 900-980° C.) would normally be considered to be a performance degrading feature as it damages the silicon quality for multicrystalline wafers (which is not the case for monocrystalline wafers). This effect is well documented. In the present sequence, the anneal to improve the hydrogen passivation seems to rectify damage caused by the high temperatures used in the oxide growth step.

Laser Doping Process

Figure 6:
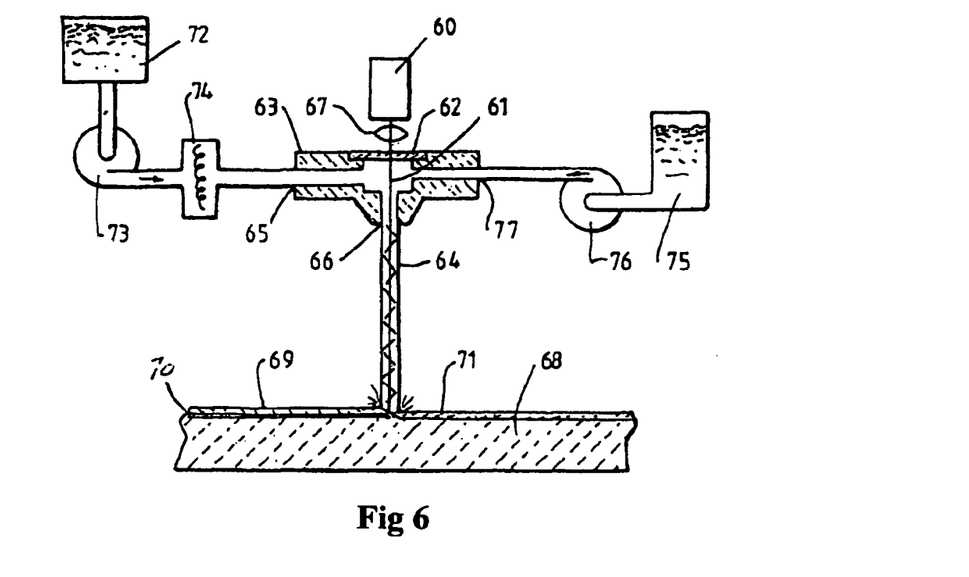
FIG. 6 schematically illustrates the arrangement of a laser and liquid jet when used to process a surface of a target.
Figure 7:
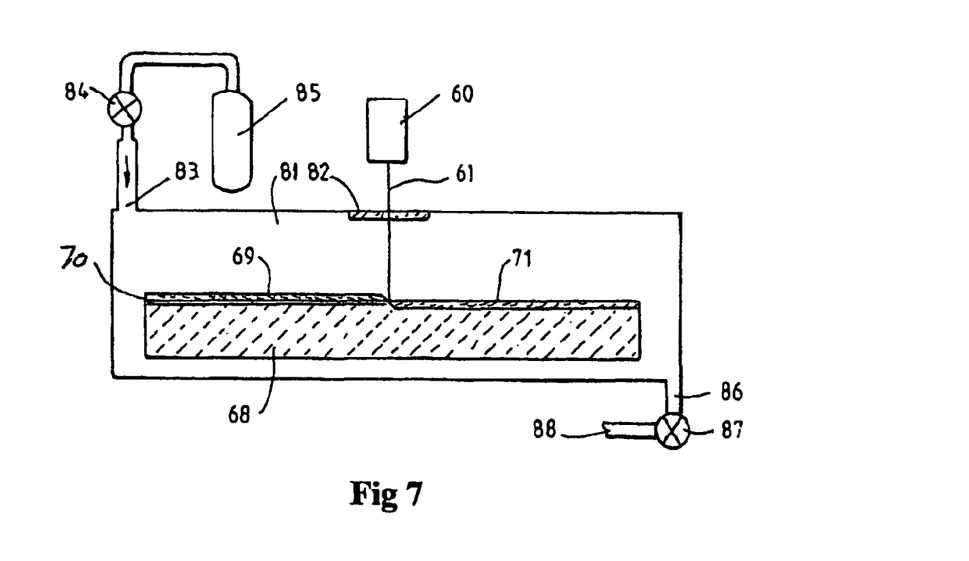
FIG. 7 schematically illustrates a laser operated to heat a target in a gaseous environment to process a surface of a target.

The laser doping process for a silicon wafer involves melting localised surface regions of the wafer in the presence of either n-type or p-type dopants, so that the dopants are incorporated into the molten region. Referring to FIG. 5, this facilitates the formation of a selective emitter structure with the heavily doped regions 22 self-aligned to the overlying metal contact 23, 24, 25. The dopants can be included within a surface dielectric layer 17, be applied as a coating on top of or below the dielectric layer (also potentially the antireflection coating 16), they may be present in the silicon in an unactivated state whereby they are absorbed into the silicon structure (or activated) by the melting and refreezing process or they may be applied to the region in gaseous or liquid form whilst the silicon is molten (described below with reference to FIGS. 6 and 7). Referring to the FIG. 1 example, to use laser doping in conjunction with subsequently forming self aligned metal contacts 23, 24, 25 onto the highly doped laser melted regions 22, the silicon surface is coated with a dielectric layer 17 that protects the unmelted regions from the subsequent metal contact formation process as taught by Wenham and Green, U.S. Pat. No. 6,429,037. The laser doping process automatically destroys the overlying dielectric layer in the laser doped regions, therefore exposing the silicon surface for subsequent metal contact formation which can be done in a self-aligned process such as via metal plating. The dielectric layer or layers can include an antireflection coating 16, surface passivation layer 14, dopant source 17, hydrogen source (not shown) for surface and/or grain boundary and/or defect passivation, protection layer (also not shown) for the silicon surface and/or plating mask, or one or more layers which potentially in combination or singly perform one or more of these functions.

The dopant source may also be incorporated within the silicon itself, rather than in a separate layer or coating. In other words, the laser may be used to locally melt the silicon that is already loaded with dopant such that the melting and refreezing process causes the free dopants (commonly referred to as interstitial atoms which are electrically inactive dopants that are not bonded normally within the silicon lattice) to be absorbed into the crystalline silicon structure (lattice) and redistributed from original location. For example when an n-type dopant is thermally diffused into the surface of the silicon in an emitter forming step, many more n-type dopant atoms may be diffused into the silicon than actually become electrically active. Laser melting can then be used to allow these extra dopant atoms to redistribute themselves and become active within the silicon to form more heavily doped contact regions.

The number of inactive dopants that will be present within the silicon (e.g. within the diffused n-type emitter) is determined by the way in which the diffusion is done. Often when diffusing dopant into a surface it will be done it in a way that attempts to keep the surface concentration of the dopant (e.g. phosphorus (P)) below the solid solubility of the dopant in Silicon, for the particular temperature at which the processing is being performed, to avoid the inclusion of too many inactive dopants. One way of avoiding excessive dopant atoms in the silicon, for example, is by diffusing through a silicon dioxide layer (most common approach) although another very common approach is simply to reduce the concentration of the dopant source.

By deliberately allowing the surface dopant concentration (e.g. phosphorous) to go above the solid solubility of the dopant in silicon, whereby large numbers of inactive dopants are incorporated into the surface, these inactive dopants can become the source of dopants for the laser doping process. Typically the emitter will be formed with a sheet resistivity in the range of 80-200 ohms per square. By incorporating a large number of inactive dopants, the sheet resistivity can be reduced by at least a factor of two in the areas treated by the laser compared to the areas not treated by the laser. For example, if the emitter is formed with a preferred emitter sheet resistivity of 100 ohms per square, this can be made to drop to about 30-40 ohms per square in areas melted by the laser. This level of sheet resistivity is sufficient for good performance but optimisation of the process may provide even better results.

FIG. 12 schematically illustrates the arrangement of a laser and liquid jet when used to process a substrate provided with a dielectric surface layer. In this case the surface layer need not provide a dopant source. As illustrated, a laser 60 emitting a laser beam 61 is projected through a covered window 62 in a nozzle unit 63. A liquid jet 64 is generated by the nozzle unit into which the laser beam 61 is coupled such that it may be guided by total internal reflection towards the target. A supply of liquid to the nozzle unit 63 is provided through ports 65 and is expelled through a nozzle orifice 66 which projects the liquid towards the target. The window 62 is oriented to receive a vertical laser beam 61 which is directed axially into the liquid jet 64. The laser beam 61 is focussed by appropriate lenses 67 before entry through the window 62. Liquid is delivered to the nozzle unit 63 with a pressure of between 20 to 500 bar via the liquid supply port 65. The liquid may be supplied from a reservoir 72 or other suitable source and pumped under pressure to the nozzle unit 63 by supply pump 73. The liquid may also be heated by heater 74 so that the temperature of the liquid jet may be controlled. The generated liquid jet 64 may have a diameter in the range of approximately 20 to 100 µm.

The liquid jet 66 and laser beam 61 are shown directed to a target which is a 250 µm silicon substrate 68 with a 30-80 nm thick silicon nitride layer surface layer 69 overlying a thin oxide layer 70. The liquid jet 64 and laser beam 61 are guided over regions of the surface layer as with conventional laser doping methods. By adding phosphoric acid to the liquid jet a strong corrosive action will take place on the silicon nitride layer and the underlying silicon where the surface becomes heated by the laser beam 61 leaving the surface layer 69 very cleanly and precise ablated, whereas the substrate 68 is left substantially intact elsewhere. Additives are added to the liquid jet 64 from one or more supply tanks 75 and injected by respective pumps 76 into the portal 77 of the nozzle unit 63. However n-type doping of a surface region 71 of the silicon can also be performed simultaneously with the nitride removal by virtue of the phosphoric acid used for cleaning, or by the inclusion of additional dopant additives such as $POCl_3$, $PCl_3$, $PCl_5$, or a mixture of these. P-type doping could also be achieved in a similar operation by selecting the appropriate dopants (e.g. Boron).

The liquid jet 66 and laser beam 61 may also be used with dopant sources included within a surface dielectric layer 17, sources applied as a coating on top of or below the dielectric layer (also potentially the antireflection coating 16), or the dopant atoms may be present in the silicon in an unactivated state whereby they are absorbed into the silicon structure (or activated) by the melting and refreezing process as described above with reference to other laser systems.

Laser operations may also be performed in a gaseous environment to achieve the doped surface region 71 without providing dopant in the liquid jet. Referring to FIG. 13, in this case the laser 60 emits laser beam 61 which is directed through a window 82 in a chamber 81 containing the target substrate 68. A dopant source in gaseous form is supplied from a pressurised storage cylinder 85 via control valve 84 and port 83, into the chamber 81. Gas is expelled from the chamber via exhaust port 86 and exhaust vale 87 to a disposal passage 88. The laser is scanned over the surface of the substrate 68 as before, melting the antireflection coating 69 and a portion of the underlying surface whereby the gaseous dopant is absorbed into the molten silicon surface material to form the doped surface layer 71.

While the use of a gaseous environment is described above in conjunction with the use of a laser beam projected within a liquid jet the gaseous environment may equally be employed with any of the other laser arrangements described above that are not associated with a liquid jet. Liquid dopant sources may also be employed with any of the laser arrangements described, other than as a liquid jet through which the laser beam is projected. The liquid source may be pooled or flowed over the surface which is being doped or may be applied as a jet directed at the point of laser heating.

It will be appreciated by persons skilled in the art that numerous variations and/or modifications may be made to the invention as shown in the specific embodiments without departing from the scope of the invention as broadly described. The present embodiments are, therefore, to be considered in all respects as illustrative and not restrictive.

The invention claimed is:

1. A method of forming emitter contacts on a surface emitter of a silicon solar cell comprising a substrate of silicon material, the method comprising:
   (i) forming the surface emitter by performing an n-type diffusion of a surface of the substrate to form an emitter surface layer;
   (ii) etching back the surface of the substrate to achieve a dopant concentration at the surface of the substrate of less than $10^{20}$ atoms/cm$^3$;
   (iii) depositing a surface dielectric layer or layers onto the etched back surface of the substrate;
   (iv) patterning the dielectric layer or layers in localized areas to expose regions of a silicon surface of the substrate where contacts are to be formed; and
   (v) selectively plating the silicon surface of the substrate in the exposed regions where contacts are to be formed to make an electrical connection to the emitter surface layer.

2. The method of claim 1 wherein the emitter surface layer is formed with a sheet resistance in the range of 10-40 Ω/square.

3. The method of claim 1 wherein depositing the surface dielectric layer or layers onto the etched back surface of the substrate comprises:
   a. growing a thin 5-30 nm silicon oxide layer; and
   b. PECVD deposition of an Anti-Reflection Coating (ARC).

4. The method of claim 3 wherein the thin silicon oxide layer is grown to a thickness of 10-20 nm.

5. The method as claimed in claim 3 wherein the ARC layer has a thickness of 65-75 nm and a refractive index of 2.0-2.1.

6. The method as claimed in claim 3 wherein the ARC layer is a single hydrogen rich layer.

7. The method as claimed in claim 3 wherein the ARC layer comprises at least two layers as follows:
   i. 80-120 angstroms of hydrogen rich material; and
   ii. 550-650 angstroms of material of refractive index 2.0-2.1.

8. The method as claimed in claim 3 wherein the ARC comprises a layer or layers of silicon nitride, aluminium oxide, titanium oxide, or a combination of these.

9. The method as claimed in claim 8 wherein the ARC comprises a layer or layers of silicon nitride.

10. The method of claim 1 wherein the surface dielectric layer or layers comprises a layer of hydrogen rich material.

11. The method of claim 10 further comprising annealing the substrate to drive hydrogen from the layer of hydrogen rich material into the substrate to passivate the silicon material.

12. The method as claimed in claim 1 wherein annealing is performed at a temperature in the range of 350 to 720° C. for 0.5 to 20 mins.

13. The method as claimed in claim 12 wherein annealing is performed at a temperature in the range of 350 to 500° C. for 5 to 20 mins.

14. The method as claimed in claim 12 wherein annealing is performed at a temperature in the range of 380 to 420° C. for 8 to 12 mins.

15. The method of claim 12 wherein annealing is performed at a temperature in the range of 500 to 720° C. for 0.5 to 8 mins.

16. The method of claim 10 wherein the hydrogen rich material is silicon nitride.

17. The method of claim 1 wherein patterning the dielectric layer or layers comprises performing a localised laser melting of the silicon substrate surface through the surface dielectric in the presence of a dopant containing source to simultaneously melt and dope the surface of the substrate, creating doped silicon n+ regions, which are more heavily doped than the emitter surface layer, in the regions where the front surface metal contacts are to be formed, while destroying the overlying dielectric layer or layers to expose a surface of the more heavily doped silicon n+ regions.

18. The method of claim 17 wherein selectively plating comprises plating a layer of nickel over the more heavily doped silicon n+ regions.

19. A method of forming emitter contacts on a surface emitter of a silicon solar cell comprising a substrate of silicon material, the method comprising:
   (i) forming the surface emitter by performing an n-type diffusion of a surface of the substrate to form an emitter surface layer with a pn junction depth of at least 1.5 μm;
   (ii) etching back the surface of the substrate to achieve a dopant concentration at the surface of the substrate to less than $10^{20}$ atoms/cm$^3$ and to increase a sheet resistance of the emitter surface layer to 100-160 Ω/square;
   (iii) depositing a surface dielectric layer or layers onto the etched back surface of the substrate;
   (iv) patterning the dielectric layer in localized areas to expose regions of a silicon surface of the substrate where contacts are to be formed;
   (v) doping the surface of the substrate in the exposed regions where contacts are to be formed whereby a dopant concentration at the surface of the exposed regions is greater than the dopant concentration at the surface of the substrate over a remainder of the surface of the substrate by a factor of at least two; and
   (vi) selectively plating the silicon surface of the substrate in the exposed regions where contacts are to be formed to make an electrical connection the emitter surface layer.

* * * * *